United States Patent [19]
Leung

[11] Patent Number: 6,064,871
[45] Date of Patent: May 16, 2000

[54] LOW POWER ΔΣ CONVERTOR

[75] Inventor: Bosco Leung, Waterloo, Canada

[73] Assignee: University Of Waterloo, Canada

[21] Appl. No.: 08/582,556

[22] Filed: Jan. 2, 1996

[30] Foreign Application Priority Data

Sep. 7, 1995 [CA] Canada .................................. 2157690

[51] Int. Cl.[7] .............................. H04B 1/26; H04B 1/28
[52] U.S. Cl. ............................ 455/323; 375/247; 341/77
[58] Field of Search ................................ 375/247, 252, 375/245; 341/77; 455/323–324, 291–292

[56] References Cited

U.S. PATENT DOCUMENTS

| | | | |
|---|---|---|---|
| 4,728,811 | 3/1988 | Iida et al. | 307/112 |
| 4,896,156 | 1/1990 | Garverick | 341/143 |
| 5,008,610 | 4/1991 | Nelson et al. | 324/84 |
| 5,181,033 | 1/1993 | Yassa et al. | 341/143 |
| 5,446,917 | 8/1995 | Krisciunas et al. | 395/800 |
| 5,463,569 | 10/1995 | Staver et al. | 364/724.1 |
| 5,495,199 | 2/1996 | Hirano | 327/337 |
| 5,557,642 | 9/1996 | Williams | 375/316 |

OTHER PUBLICATIONS

Reference Data For Radio Engineers, ITT, 10–1–2, 1975.
Mc graw–Hill Dictionary Of Science & Engineering, p. 657, 1984.

Roettcher et al., A Compatible CMOS–JFET Pulse Density Modulator for Interpolative High–Resolution A/D Conversion, IEEE Journal of Solid–State Circuits, vol. SC–21, No. 3, pp. 446–452, Jun. 1986.

Longo et al., FA 14.1: A 15b 30kHz Bandpass Sigma–Delta Modulator, Digest of Technical Papers, 1993 IEEE International Solid–State Circuits Conference; pp. 226–227; 1993.

*Primary Examiner*—Andrew I. Faile
*Assistant Examiner*—Vincent F. Boccio
*Attorney, Agent, or Firm*—Dilworth & Barrese

[57] ABSTRACT

A low power passive ΣΔ converter for baseband applications and with a built in mixer for direct conversion. For direct conversion, low power consumption is achieved by adopting a passive loop filter for the ΣΔ converter together with merging the sampling and mixing functions together utilizing a specially designed mixer. With a passive loop filter, the only gain element in the loop is a high gain, high speed, low noise comparator. The mixer can be located outside of the feedback loop, although according to one aspect of the present invention, the mixer is incorporated inside the feedback loop. For baseband applications, the same design is utilized with a simple sampling switch instead of a mixer for processing baseband signals with low power consumption.

7 Claims, 5 Drawing Sheets

LOW POWER ΔΣ CONVERTOR

FIELD OF THE INVENTION

The present invention relates in general to ΣΔ (sigma-delta) modulators, and more particularly to a low power passive ΣΔ converter for baseband applications and with a built in mixer for direct conversion.

BACKGROUND OF THE INVENTION

Modern day mobile communication transceivers must operate with high dynamic range and low power consumption in order to optimize portability. Prior art superheterodyne receiver architectures incorporate complex analogue signal processing circuits to perform signal demodulation when operating as a receiver. In an effort to overcome the requirement of complex analogue signal processing circuitry, prior art receivers have been developed utilized bandpass ΣΔ modulators for digitizing the IF (intermediate frequency) signal, followed by digital demodulation, as disclosed in Longo, L. et al, "A 15-Bit 30 kHz Bandpass Sigma-Delta Modulator", IEEE J. Solid-State Circuits Digest, pp. 226–227, 1993. This prior art approach suffers from the disadvantage of high power consumption since the conversion is performed at a multiple of the IF frequency. The major source of power dissipation in a ΣΔ modulator utilized for IF digitizing, is the operational amplifier needed to implement the loop filter in the ADC (analogue-to-digital convertor) and the active circuits utilized in the mixer, which is usually implemented in the form of a Gilbert multiplier.

In U. Roettcher et al, "A Compatible CMOS-JFET, Pulse Density Modulator for Interpolative High Resolution A/D Conversion", IEEE J. Solid-State Circuits, pp. 446, Vol.SC-21, No. 3, June 1986, replacement of the active loop filter with a passive RC loop filter is suggested for baseband operation. However, this approach suffers from a number of disadvantages. Firstly, resistors are not easily integrable into an integrated circuit. Secondly, prior art converters constructed using RC loop filters suffer from timing jitter problems. Thirdly, an extra mixer is required for direct conversion. The first two disadvantages are common to both baseband and direct conversion applications, while the third problem is specific to direct conversion applications.

SUMMARY OF THE INVENTION

According to one embodiment of the present invention, a passive ΣΔ converter is provided in which a simple sampling switch and passive SC (switched capacitor) loop filter are used for processing baseband signals having large bandwidth, resulting in low power consumption, low noise and high dynamic range. According to a further embodiment, a direct converter is provided in which the frequency translation and sampling operations inherent in the ADC are performed in a single step, thereby simplifying circuitry and reducing power consumption. Special designed switches are utilized instead of Gilbert multipliers, to demodulate the input IF signal from passband to baseband. According to yet another embodiment of the invention, a direct converter is provided for either 1-bit or multi-bit conversion, utilizing either and active or passive path loop filter and incorporating a further mixer in the feedback path.

BRIEF DESCRIPTION OF THE DRAWINGS

A detailed description of the invention and its embodiments is provided below with reference to the following drawings, in which:

FIG. 3b shows a timing diagram for operation of the switched capacitors in the circuit of FIG. 3a;

DETAILED DESCRIPTION OF THE INVENTION AND EMBODIMENTS

Figure 1:
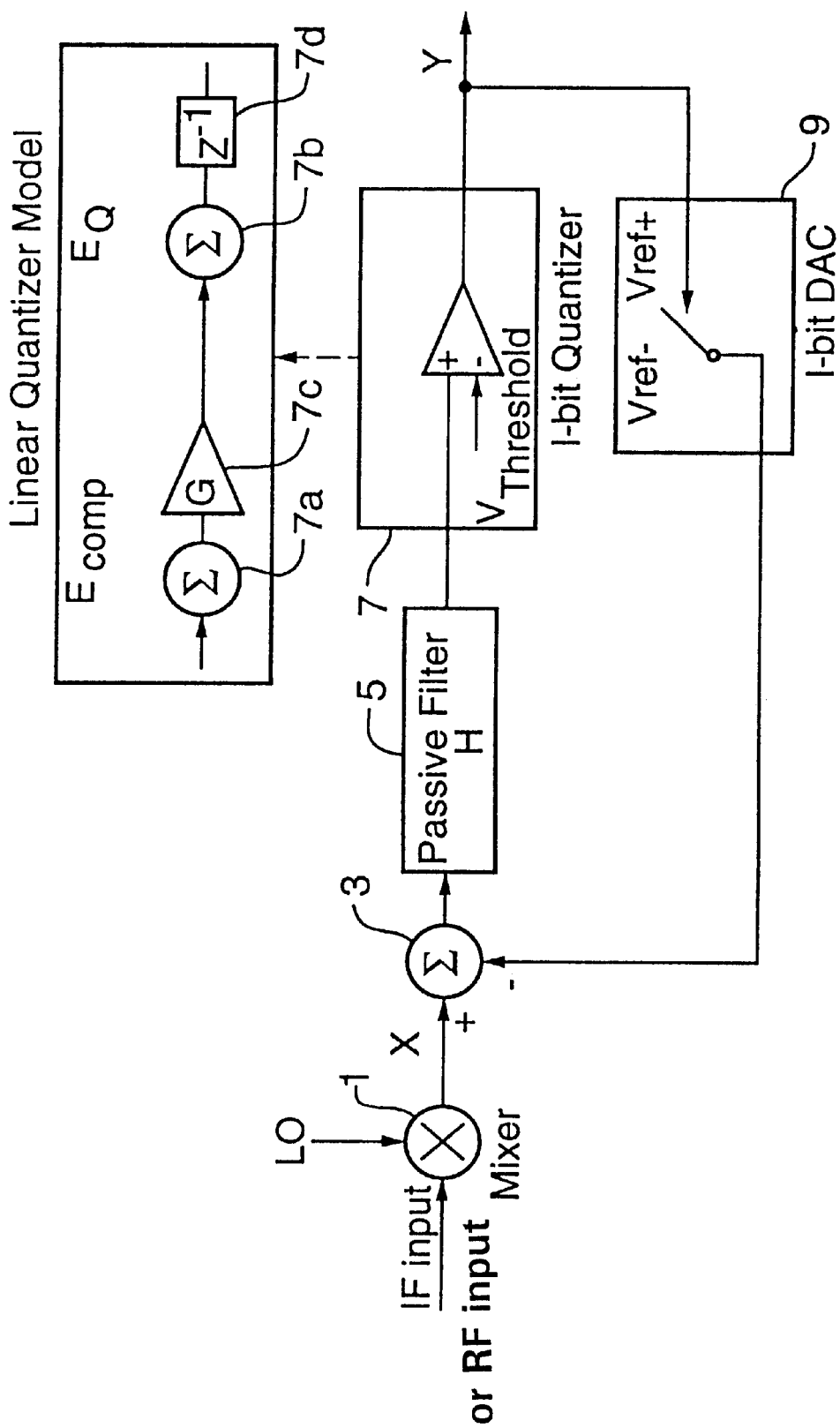
FIG. 1 is a realization diagram of a passive ΣΔ modulator with direct conversion according to the present invention.

FIG. 1 is a realization diagram of a passive ΣΔ modulator with direct conversion. An intermediate frequency (IF) input signal is received and applied to a first input of a mixer 1. However, it will be understood that the input signal may be an RF signal or other high frequency modulated signal. A local oscillator (LO) signal is applied to a second input of the mixer 1. The mixer generates a demodulated signal X which is applied to the minuend input of a subtracter 3. The difference signal output from subtracter 3 is applied to the input of a loop filter 5 whose output is connected to the input of a one-bit quantizer 7. The digital code Y output from one-bit quantizer 7 is converted to analogue via a one-bit DAC 9 (digital-to-analogue converter), the analogue output of which is connected to the subtrahend input of subtracter 3 for completing the feedback loop of the ΣΔ modulator.

As discussed briefly above, and in greater detail below, according to the preferred embodiment, the loop filter 5 is constructed as a passive low pass path filter having a first order transfer function H. Since the low pass path filter 5 is constructed utilizing no active components, very little power is consumed (ie. the poles of the passive loop filter are designed to be at a low frequency range). The specific design of the preferred passive switched capacitor (SC) loop filter 5 is discussed in greater detail below with reference to FIG. 3. Although the passive SC loop filter has a non-zero parasitic capacitance, the movement of poles in the low pass ΣΔ modulator (for direct conversion) does not move the null of the quantization noise power spectral density (psd), which stays at DC. This is different from the case of a bandpass ΣΔ modulator where the null of the quantization noise psd is sensitive to parasitic capacitances, thereby requiring the use of active integrators which consume considerable power. Because the implementation of ΣΔ modulator according to the embodiment of FIG. 1 is utilized for direct conversion, the signal is always mixed down to DC irrespective of the pole positions and is therefore not affected by the presence of parasitic capacitances. According to one aspect of the present invention, the sampling switch is used to implement the mixing operation, which permits the mixer to be passive and results in the advantages of power savings and reduced IM$_3$ (third order intermodulation product). It is well known that in any mixing operation non-linearity can arise. However, the nature of the non-linearity that arises in the mixer is different from that of non-linearity in a sampler, and errors such as IM$_3$ that are not normally significant in A/D conversion can become significant in the implementation of an SC-based mixer. It is known that IM$_3$, for example, is strongly influenced by switch size, rise/fall time of the sampling clock (i.e. local oscillator in the present embodiment) as well as the frequency of the input signal. Thus, according to the present invention, the W/L (width/length) of the combined mixing and sampling switch of the preferred embodiment must be designed to be large enough to reduce IM$_3$.

Figure 2A:
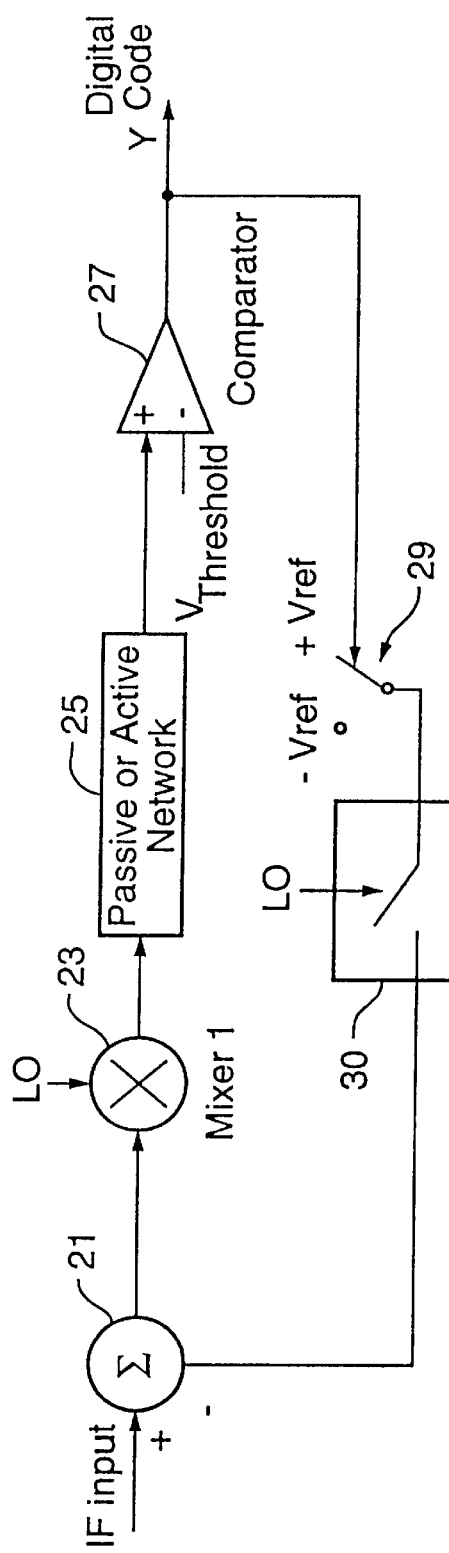
FIG. 2a is a realization diagram of a 1-bit passive/active ΣΔ modulator for direct conversion with a sampling mixer inside the loop, according to an alternative embodiment of the invention.

According to the alternative embodiment of FIG. 2a, IM$_3$ from the mixer is suppressed by placing the mixer 23 in the feed-forward path of the modulator. However, an additional mixer 30 is thus required in the feedback path. This feedback mixer 30 translates the output baseband signal Y back to the incoming carrier frequency via sampling at the local oscillator rate ($f_{LO}$).

In the case of a $\Sigma\Delta$ modulator with a one-bit quantizer 27, the additional mixer 30 in the feedback path is inherently linear and can be implemented using simple switches operated at a sampling frequency equal to the local oscillator (LO) carrier frequency ($f_{LO}$).

It should also be noted that the implementation of FIG. 2a can be equally applied to a $\Sigma\Delta$ modulator using an active loop filter 25 (e.g. SC or continuous time integrator).

Figure 2B:
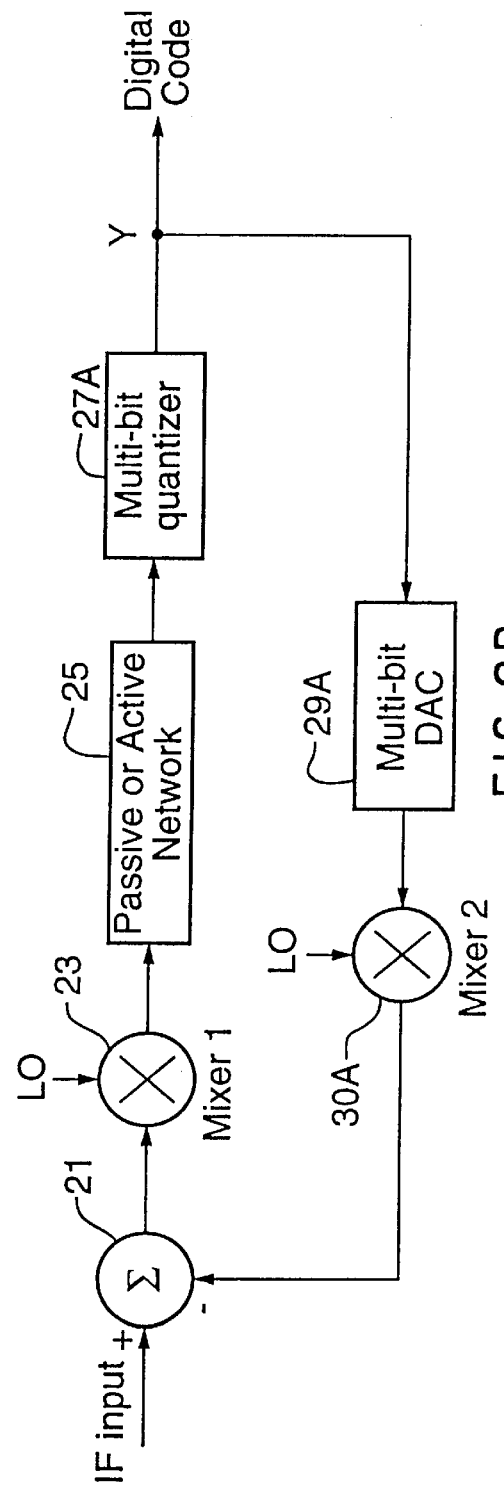
FIG. 2b is a realization diagram of a multi-bit passive/active ΣΔ modulator for direct conversion with a true mixer inside the loop, according to a further alternative embodiment of the invention.

Furthermore, the quantizer 27 may be either a one-bit quantizer as shown in FIG. 2a, or a multi-bit internal quantizer 27A as shown in the multi-bit implementation of FIG. 2b. However, for the multi-bit implementation the sampling mixer 30 must be replaced by a true mixer 30A, as shown in FIG. 2b. The mixer 21 and ADC 29 (and multi-bit ADC 29A in FIG. 2b) operate in the usual manner. Simulation results confirm that IM$_3$ of mixer 23 can be suppressed by more than 10 dB in this arrangement.

Returning to the realization diagram of FIG. 1, using a linear model of the quantizer 7, the transfer function of the passive $\Sigma\Delta$ modulator may be expressed by equation (1) as:

$$Y = \frac{GHz^{-1}}{1+GHz^{-1}} X + \frac{E_Q^{-1}}{1+GHz^{-1}} + Gz\frac{-1}{1+GHz-1} E_{comp}$$

where $E_Q$ is the quantization noise, $E_{comp}$ is the equivalent input noise of the internal comparator of the quantizer, and G is the equivalent gain provided by the comparator.

In the passive implementation of FIG. 1, the gain G is on the order of thousands as opposed to being close to unity as in the case of an active loop filter. The gain is calculated by assuming a zero input to the quantizer 7, resulting in an input to the passive filter 5 consisting of a square wave which oscillates at a frequency of fs/2, where H is a first order transfer function. The output of the filter 5 thus comprises a square wave oscillating at the same frequency but substantially reduced in amplitude (reduction is around H(w=fs/2)). The output of the quantizer 7 therefore comprises a square wave having frequency of fs/2 and unit amplitude. The gain G is then calculated to be 1/H(w=fs/2). For simplicity, the gain G may be assumed to remain constant for a non-linear system when the input is replaced with an arbitrary wave form, although in general this is true only for a linear system. In addition, since H(w=fs/2) is small, the input level to the comparator is small and the comparator must resolve a small input signal, as discussed in greater detail below. Furthermore, since the passive filter 5 has no gain, the equivalent input noise of the comparator ($E_{comp}$) is reflected back to the input with a loss.

It can be seen from equation 1, that in order to suppress the quantization noise ($E_Q$) to a predetermined level in the baseband and realize a desired signal-to-noise ratio (SNR), sufficient loop gain (ie. GH) must be provided. Assuming that G is a constant with respect to frequency, the low pass transfer function H of the loop filter 5 translates into a high pass quantization noise transfer function. For a conventional passive RC implementation, the general transfer function of an all-pole nth order low pass filter in the s-domain may be expressed by Equation 2, as:

$$H(s) = \frac{g\prod_{i=1}^{n} s_{pi}}{\prod_{i=1}^{n}(s-s_{pi})}$$

where $s_{pi}$ represents the i-th pole of the filter and g is the DC gain factor of the loop filter which is unity for a passive filter. Therefore, a large loop gain GH can only be realized by making the gain G large.

Therefore, in the design of the passive $\Sigma\Delta$ modulator of the present invention, the loop gain must first be determined from the SNR requirement. This results in the required gain G, and hence the proper input signal level to the comparator, or equivalently the output level of the loop filter 5. The attenuation level of the loop filter 5 in turn allows for the derivation of the proper pole location of the loop filter. Although increased attenuation results in increased baseband quantization noise suppression, it also results in higher comparator noise $E_{comp}$, resulting in a design trade off. Finally, in order to compensate for the delay of the loop filter 5 and improve the modulator stability, a zero is introduced using a phase-delay compensation scheme, as discussed in greater detail below with reference to FIG. 3.

Figure 3A:
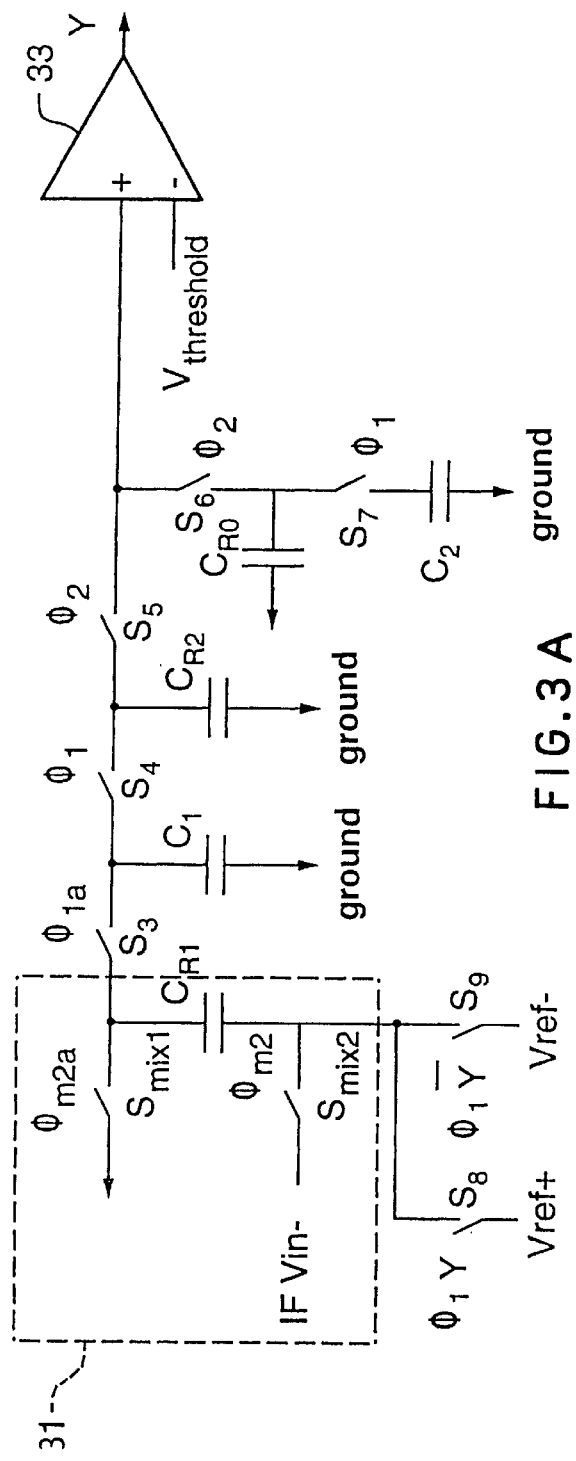
FIG. 3a shows a switched capacitor implementation of a second order passive ΣΔ modulator with direct conversion according to the preferred embodiment.

Turning now to FIG. 3a, a detailed circuit diagram is shown. The input signal (IF Vin) is sampled via switches $S_{mix1}$ and $S_{mix2}$ onto a capacitor $C_{R1}$, thereby implementing the combined mixer and sampler 31 according to the present invention. If the input signal (IF Vin) comprises $V_{carrier}$+$V_{in}(n)$, where $V_{carrier}$ is the carrier signal and $V_{in}(n)$ is the baseband input signal, then where the clock frequency of $\phi_{m2}$ (ie. $f_{\phi m2}$) is the same as the frequency of $V_{carrier}$, the IF signal is modulated to DC directly, thereby performing direct conversion (ie. $f_{clk}$=$f_{LO}$). Alternatively, the clock frequency can be made slightly different from the frequency of $V_{carrier}$ in order to perform a low IF solution. For baseband applications, the clock frequency $f_{\phi m2}$ is set by the required oversampling ratio (OSR) needed to achieve a desired SNR (ie. $f_{\phi m2}$=2*OSR*$f_{NYQUIST}$).

The switches $S_{mix1}$, $S_{mix2}$, $S_3$, capacitors $C_{R1}$ and $C_1$ comprise the switched capacitor based first stage of the loop filter 5. Switches $S_{mix1}$ and $S_{mix2}$ also function as the mixer 1. Switches $S_4$, $S_5$, $S_6$, $S_7$ and capacitors $C_{R2}$, $C_{R0}$ and $C_2$ form the second stage of the loop filter. Comparator 33 functions as the quantizer for the $\Sigma\Delta$ modulator. Switches $S_8$ and $S_9$ switch between reference voltages Vref+ and Vref− for implementing the feedback DAC of the convertor.

Figure 3B:
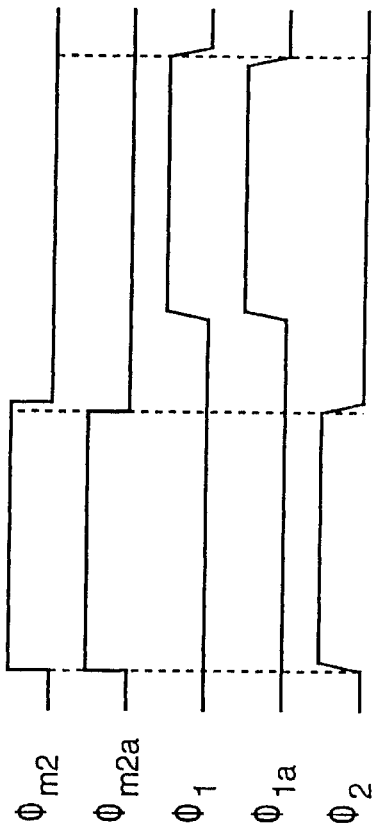

The various switches in the circuit of FIG. 3a are implemented as MOS transistors in a well known manner, and are switched according to the wave forms illustrated in FIG. 3b. For baseband applications, the switching signals can be on the order of 1 Mhz, whereas for direct conversion, $f_{\phi 1}$ and $f_{\phi 2}$=$f_{LO}$ (eg. 10 Mhz, 100 MHz, etc).

As shown in FIG. 3b, the falling edges of switching signals $\phi_{m2a}$ and $\phi_{1a}$ are slightly ahead of $\phi_{m2}$ and $\phi_1$, respectively, so that switch $S_{mix2}$ opens slightly before switch $S_{mix1}$ and switch $S_3$ opens slightly before switch $S_4$, thereby insuring bottom plate sampling of capacitors $C_{R1}$ and $C_1$, respectively.

From FIG. 3b it will also be noted that $\phi_{m2a}$ is the same waveform as $\phi_2$ except for the leading and trailing edges. Specifically, the rise and fall times of the local oscillator (LO) signal (ie. $\phi_{m2}$ and $\phi_{m2a}$) must be much smaller than $\phi_2$ to further reduce $IM_3$. As discussed briefly above, because mixing is done using sampling in the circuit of FIG. 3a, non-linearity can arise which makes the design of the individual switches S quite different than when used for baseband sampling alone. This non-linearity depends on the switch size, rise/fall time of the clock (i.e. local oscillator) waveform as well as the frequency of the input signal. When used as a mixer, there are other design considerations, such as noise figure and conversion gain, that are normally of little concern when the switches are used for straight forward sample/hold functions. The non-linearity of greatest concern in a mixer circuit is $IM_3$, as opposed to harmonic distortion, as in the case of a sample/hold circuit. At low to moderate frequencies (eg. 10 Mhz) one way to reduce $IM_3$ is to increase the switch size whereas at high frequencies (eg. 100 Mhz and up), $IM_3$ depends to a greater extend on the clock waveform.

Irrespective of the operating frequencies, incorporation of a mixer inside the feedback loop reduces $IM_3$, or alternatively, overall power consumption may be reduced for a given $IM_3$. In classical feedback theory, the amount of $IM_3$ reduction due to non-linearity in the mixer is proportional to the loop gain, for a fixed mixer output level. In a $\Sigma\Delta$ modulator, if a multi-bit quantizer is used, the amount of $IM_3$ reduction can be predicted using linear feedback theory by linearizing the quantizer, as shown in FIG. 1.

Since the comparator 33 is the only active component used in the passive $\Sigma\Delta$ modulator of the present invention, the comparator must be designed to exhibit minimum power consumption for a given speed and resolution and noise level. Offsets from the comparator and other sources in the feedback loop may be corrected by well known adaptive techniques. Consequently, the comparator 33 may not need to have offset cancellation. This means that the comparator 33 does not need to be unity gain stable, and therefore lends to a speed advantage over the prior art. Nonetheless, normal offset cancellation (at the inputs as well as output) may be provided for resetting the input of the comparator 33 and hence the top plate of capacitor $C_{R2}$ to ground and shifting the poles with the consequence that quantization noise may rise.

The resolution requirement for the comparator 33 in a passive $\Sigma\Delta$ modulator is different from that in an active $\Sigma\Delta$ modulator. The resolution must be large enough to make G, and hence GH, large enough to suppress the quantization noise and hence realize the required SNR. This means that the quantizer receives a very small but fast varying signal, which is different from the case of an active modulator where a very large baseband gain H is usually achievable, making a low G (eg. unity) quite acceptable. Consequently, the comparator 33 must exhibit enough resolution to resolve the small input signal. For a given technology, the maximum resolution of a comparator is limited, and it is impossible to increase the gain of a quantizer arbitrarily. This, in turn, defines a requirement on the loop filter: specifically, the highest frequency component (ie. the clock signal) should only be attenuated to such a magnitude that the comparator 33 can resolve since the high frequency signal at the input of the comparator is used to toggle the output of the comparator for effective interpolation. Otherwise, the effective clock rate (ie. the effective oversampling ratio), is reduced, and the system performance is degraded. Thus, in the passive $\Sigma\Delta$ modulator of the present invention, the resolution of the comparator 33 used in the quantizer determines the signal-to-noise ratio of the entire system. This is one of the essential differences between the passive $\Sigma\Delta$ modulator of the present invention and prior art active modulators.

Since the only gain element in the loop is the comparator 33, the input referred noise must be minimized. Several noise sources may limit the resolution of the comparator 33, which, as is well known, comprises a preamplifier implemented in the present application via a differential transistor pair, and a latch connected to the preamplifier output. These noise sources include thermal noise ($noise_1$) in the preamplifier of the comparator, kT/C noise due to the switches at the input ($noise_2$) due to switches $S_{mix1}$ and $S_{mix2}$, and noise from the latch following the preamplifier ($noise_3$). Considering the above noise sources, the design of the comparator 33 can be optimized for a given power budget. Specifically, $noise_1$ can be reduced by increasing the transconductance of the input differential pair of transistors, $noise_2$ can be reduced by increasing the internal gate capacitance at the input of the differential transistor pair, and $noise_3$ can be reduced by increasing the gain of the preamplifier.

Figure 4:
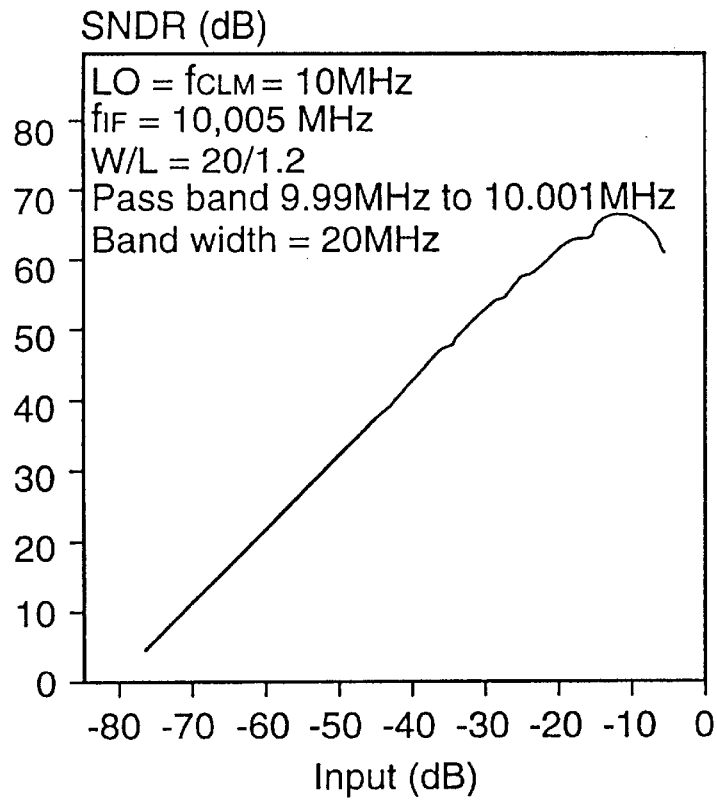
FIG. 4 is a graph showing measured signal-to-(noise plus distortion) ratio versus input signal level.
Figure 5:
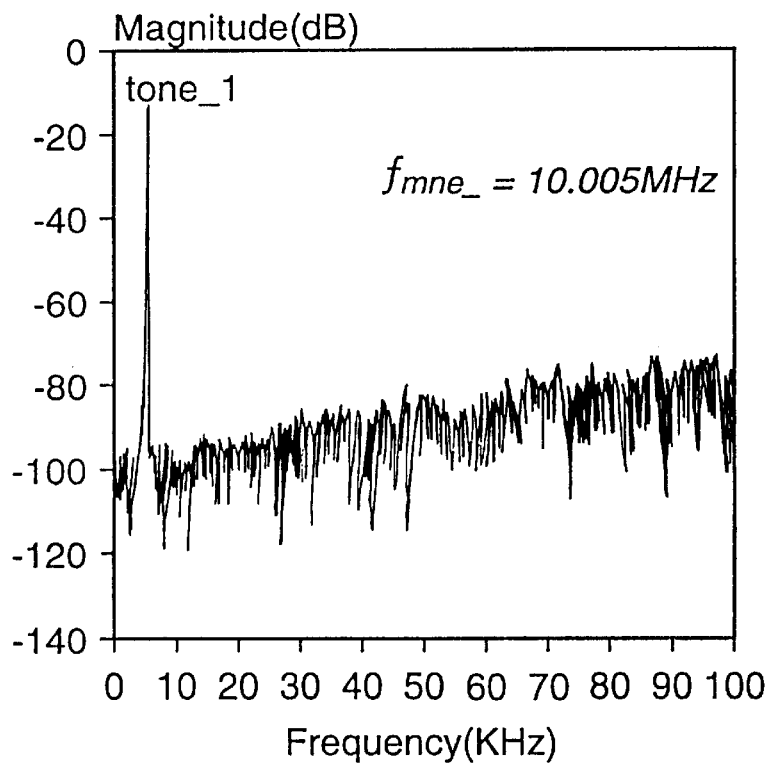
FIG. 5 is a graph showing measured output spectrum of the second order passive ΣΔ modulator of FIG. 3a with a one tone input.
Figure 6:
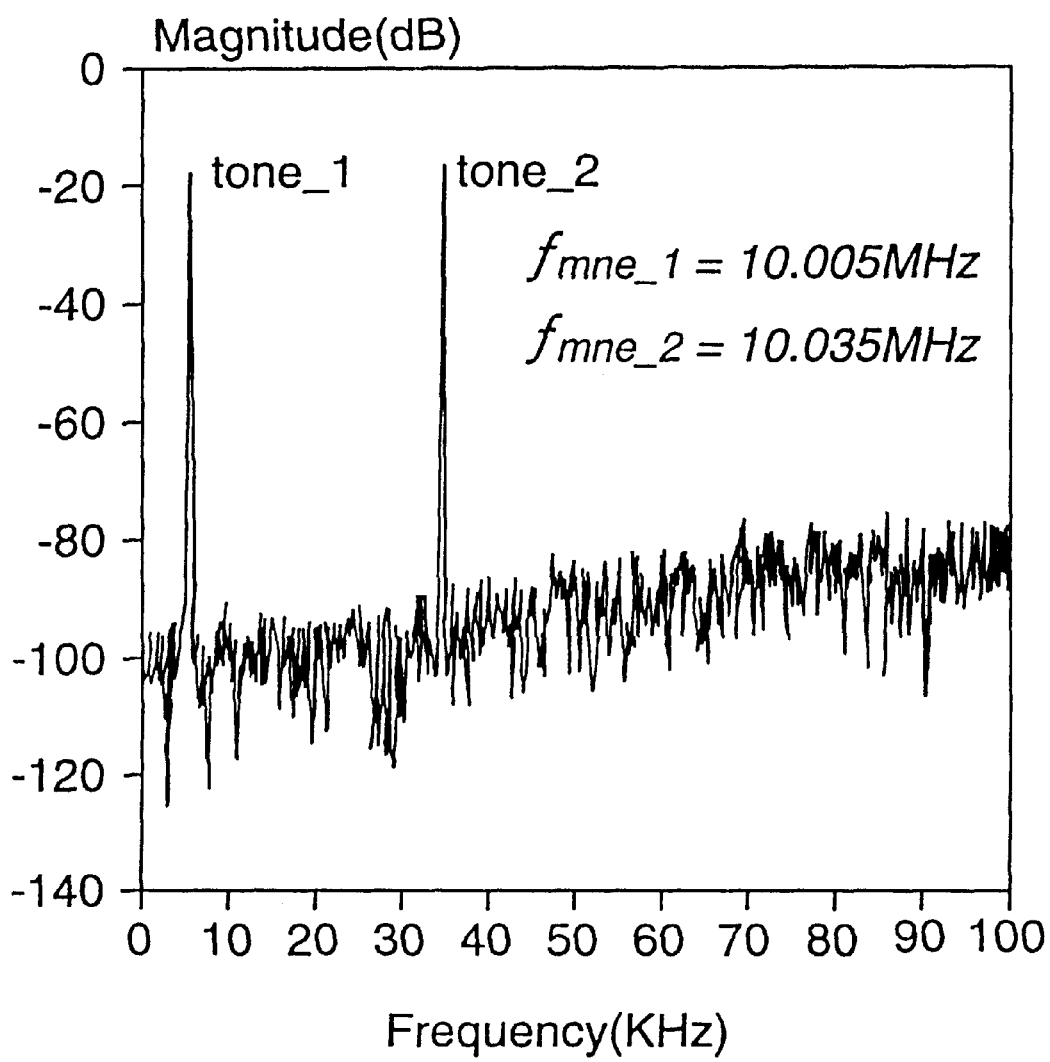
FIG. 6 is a graph showing measured output spectrum of the second order passive ΣΔ modulator of FIG. 3a with two tone input.

Testing results on an implementation of the circuit according to the preferred embodiment are provided in FIGS. 4–6. FIG. 4 shows the measured SNDR (signal-to-(noise plus distortion) ratio) versus the input, with an IF input (ie. 10 Mhz) and a mixer having W/L of 20/1.2. FIG. 5 shows the measured output spectrum of the passive second order $\Sigma\Delta$ modulator of the preferred embodiment by with a 10 Mhz single tone input. FIG. 6 shows the output spectrum of a two-tone test with a mixer having W/L of 20/1.2. The testing results are further summarized in Table 1, as follows:

TABLE 1

| | |
|---|---|
| SNDR | 67 dB |
| IM3 | −82 dB (input = 12.8 dB) |
| Dynamic Range | 72 dB |
| Signal Bandwidth | 9.99 MHz to 10.001 MHz |
| IF (Carrier) frequency | 10 MHz |
| Full Scale | 2V |
| Power Supply | 3.3V |
| Power Consumption | 0.25 mW |
| Active Area | 0.4 mm² |
| IC Technology | 1.2 µm CMOS |

In conclusion, the direct conversion architecture of the present invention results in a $\Sigma\Delta$ modulator implemented with passive loop filter and built in mixer. Both features help to improve power dissipation, resulting in a power consumption in a successful prototype of only 0.25 mW. The $\Sigma\Delta$ modulator of the present invention is capable of processing narrow band signals which arise naturally in wireless applications. The feedback in the $\Sigma\Delta$ modulator also allows the mixer to trade off distortion for better power usage. With all of these features incorporated into an experimental prototype in 1.2 µm CMOS technology, test results showed that the modulator could convert and digitize a 10.005 Mhz IF signal having a bandwidth of 20 KHz with 14-bit resolution, while dissipating only 0.25 mW of power from a 3.3 V power supply. The converter is characterized by a peak SNDR of 67 dB, an $IM_3$ of −82 dB and occupies an area of only 0.4 mm². The same design, with a simple sampling switch instead of a mixer for processing baseband signals, has a measured 14-bit resolution for a baseband signal having a bandwidth of 20 KHz, an input of 5 kHz and $f_{clk}$=10 MHz, while dissipating only 0.24 mW of power from the 3.3 V source.

Alternative embodiments and modifications of the invention are possible without departing from the sphere and scope of the claims appended hereto.

I claim:

1. A low power sigma-delta converter comprising:
   a) a sampling mixer for frequency translating and sampling a modulated input signal utilizing a local oscillator signal to produce a sampled input signal;
   b) a subtracter for receiving and subtracting an analog feedback signal from said sampled signal and in response generating a difference signal;
   c) a passive path loop filter for receiving and filtering said difference signal;
   d) a comparator for receiving and quantizing said difference signal filtered by said passive path loop filter and in response generating an output digital code; and
   e) a digital-to-analog converter for receiving and converting said output digital code to said analog feedback signal and transmitting said analog feedback signal to said subtracter, wherein said sampling mixer further comprises a first switched capacitor having one terminal connected via a first switch to receive said modulated input signal and a second terminal connected via a second switch to ground, said first switch being clocked via said local oscillator signal, wherein said first and second switches are each of a size characterized by a width-to-length ratio (W/L) greater than 18/1.2 and the rise and fall times of said local oscillator signal are within a range characterized as substantially eliminating intermodulation distortion product, wherein said sampling mixer further comprises a third switch connected intermediate said one terminal and a source of positive reference voltage and a fourth switch connected intermediate said one terminal and a source of negative reference voltage, said third and fourth switches being clocked via inverted and non-inverted versions of said output digital code.

2. The low-power sigma-delta converter of claim 1, wherein said modulated input signal comprises an IF signal.

3. The low-power sigma-delta converter of claim 1, wherein modulated input signal comprises an RF signal.

4. The low-power sigma-delta converter of claim 1, wherein said passive path loop filter comprises at least one further switched capacitor connected to said first switched capacitor and to an input of said comparator for effecting a low-pass filter with low-frequency poles, thereby minimizing power consumption.

5. The low-power sigma-delta converter of claim 1, wherein W/L=20/1.2.

6. The low-power sigma-delta converter of claim 1, wherein said second switch is clocked via said local oscillator signal.

7. The low-power sigma-delta converter of claim 1, wherein said second switch is clocked via a further version of said local oscillator signal having an advanced falling edge, wherein said further version of said local oscillator signal is within a range characterized as substantially eliminating intermodulation distortion product.

* * * * *